United States Patent [19]

Nordling

[11] 4,169,994
[45] Oct. 2, 1979

[54] CRYSTAL OSCILLATOR AND DIVIDER

[75] Inventor: Neal F. Nordling, White Bear Lake, Minn.

[73] Assignee: Cardiac Pacemakers, Inc., St. Paul, Minn.

[21] Appl. No.: 873,899

[22] Filed: Jan. 31, 1978

[51] Int. Cl.$^2$ .................. H03K 21/36; H03K 21/06; H03K 21/10

[52] U.S. Cl. ................ 328/41; 307/226 R; 328/45

[58] Field of Search ............. 328/39, 41, 45; 307/225 R, 226 R

[56] References Cited

U.S. PATENT DOCUMENTS

| | | | |
|---|---|---|---|
| 3,571,728 | 3/1971 | Andrea | 328/41 |
| 3,896,387 | 7/1975 | Kokodo | 328/39 |
| 3,976,946 | 8/1976 | Schroder | 328/39 |
| 4,034,302 | 7/1977 | May | 328/39 |
| 4,041,403 | 8/1977 | Chiapparoli | 328/39 |

Primary Examiner—John S. Heyman
Attorney, Agent, or Firm—Orrin M. Haugen; Thomas J. Nikolai

[57] ABSTRACT

A frequency divider for converting a standard frequency output from a crystal controlled oscillator to a lower frequency which is compatible with digital devices operating in a decimal mode. The oscillator output pulses and the complement thereof are fed to first and second AND gates which are respectively enabled by the complement and true outputs of a control flip-flop. The outputs from these two AND gates are ORed together and applied to the clock input of a synchronous, programmable, multi-bit counter whose carry output terminal is connected to a first D-type control flip-flop, through an inverter, the state of which determines the initial values to be periodically loaded into the multi-bit counter and which also controls the setting of the second D-type control flip-flop.

6 Claims, 2 Drawing Figures

CRYSTAL OSCILLATOR AND DIVIDER

BACKGROUND OF THE INVENTION

I. Field of the Invention

This invention relates generally to digital frequency divider apparatus and more specifically to a frequency divider which will convert the output from a crystal controlled oscillator utilizing a commonly available crystal as its operative element to produce an output pulse train which is compatible with the decimal number system.

II. Description of the Prior Art

Many types of frequency dividers are known in the digital computing and signal processing arts for converting the frequency of the output from a pulse source to a desired lower frequency. The simplest form of divider for pulse type signals is a bistable flip-flop stage which, when coupled to the pulse source, effectively divides the frequency of this source by two. By cascading plural flip-flop stages, one obtains frequency division by a factor of $2^N$, where N is the number of bistable stages utilized.

In the digital watch industry, which has experienced drastic growth since the advent of large scale integration of semiconductor devices, a common pulse source utilized is a stable oscillator having a crystal as its frequency determining element. The digital watch industry has generally standardized on a crystal having a natural frequency of 32.768 KHz. When the output from such an oscillator is applied to a 15 stage binary counter, the frequency of the incoming signal is effectively divided by $2^{15}$ or 32,768 to produce one pulse every second. Because crystals having a natural frequency of 32.768 KHz are so commonly used in large quantities in the digital watch field, economies of scale have resulted and such crystals may be obtained at relatively modest cost. Then too, because of their ready availability, their use in electronic devices other than digital chronometers would be advantageous from a manufacturing standpoint, provided a frequency divider can be devised to produce signals of a frequency compatible with these other devices.

For example, there is disclosed in the David J. Fischer application Ser. No. 724,019, filed Sept. 16, 1976 and entitled "PROGRAMMABLE DEMAND PACER" a cardiac pacemaker which makes extensive use of digital devices. Timing intervals are established in this pacer unit by driving one or more counters from a digital clock source. In this device, as well as in many others which may be envisioned, it is desirable to produce clock pulses at a frequency which is a predetermined power of 10, e.g., 10 KHz, 1 KHz, etc. If one is to utilize a crystal oscillator having the commonly available digital watch-type crystal used therein, it is desirable to have a frequency divider which will effectively divide the oscillator output by a factor which is other than a power of 2. Specifically, in order to have a clock signal of a frequency of 10 KHz, it would be necessary to frequency divide by a factor of 3.2768.

Many circuits have been devised for frequency dividing by various factors. For example, the Pugh U.S. Pat. No. 3,189,832 describes a digital circuit for frequency dividing by a factor $(N+\frac{1}{2})$ where N is a whole number. Similarly, the Andrea U.S. Pat. No. 3,571,728 describes a frequency divider for effecting division by a factor of N/2 where N is any integer. The Kokado U.S. Pat. No. 3,896,387 illustrates a circuit arrangement for frequency dividing by a factor of 2/N where N is an odd integer. The Patents to Fletcher et al. (U.S. Pat. No. 3,906,374), McGuffin (U.S. Pat. No. 3,943,379), Green (U.S. Pat. No. 3,982,199) and Chiapparoli (U.S. Pat. No. 4,041,403) teach digital circuits for frequency dividing by various other factors.

None of the above-described prior art patents, however, teaches or suggests the way in which a pulse train having a frequency which is an integral power of 2 may be frequency divided to produce a lower frequency pulse train which is an integral power of 10. Thus, the prior art has failed to solve the problem of how one might utilize a crystal controlled oscillator which incorporates the commonly available 32.768 KHz crystal in an electronic device which is designed to employ a clock source operating in the base 10 system.

SUMMARY OF THE INVENTION

In accordance with the teachings of the present invention, there is provided the design of a digital frequency divider which will accept as its input the output from a pulse source whose frequency is a predetermined power of 2 and which will produce a usable output signal whose frequency is an integral power of 10. To accomplish this end, there is provided a four stage, programmable, binary counter which may have an initial value periodically loaded into the counter. The input signal which is a signal having a frequency which is an integral power of 2 and the binary complement thereof are applied through gating means to the so-called Clock input terminal of the counter. Furthermore, first and second control flip-flops are coupled in circuit with the Carry Out terminal of the counter and with the aforementioned gating means in such a way that one or the other of two binary numbers are alternately entered into the counter each time a Carry Out Signal is generated. The second control flip-flop is coupled to the output from the first flip-flop and its output is, in turn, used to determine whether the incoming signal to be divided or its complement will be used to advance the counter.

Using the foregoing circuit arrangement, it is possible to effect division of the incoming signal train by a factor which causes the output from the frequency divider to closely approximate an integral power of 10. Therefore, assuming that the oscillator output has a frequency of 32.768 KHz and that the frequency divider of the present invention effects division by a factor of 3.250, the resulting output from the frequency divider will be approximately 10 KHz.

OBJECTS

It is accordingly a principal object of the present invention to provide a new and improved design for a digital frequency divider.

Another object of the invention is to provide a frequency divider which may be used to convert an incoming signal having a frequency which is an integral power of 2 to an output signal whose frequency is an integral power of 10.

Still another object of the invention is to provide a relatively simple frequency divider which will convert a frequency of 32.768 KHz to a frequency of approximately 10 KHz.

Yet still another object of the invention is to provide a frequency divider of the type described which is implemented with standard, commercially available integrated circuit devices.

Other and further objects of the present invention will become apparent to those skilled in the art upon a study of the following specification, appended claims, and accompanying drawings.

DESCRIPTION OF THE PREFERRED EMBODIMENT

Figure 1:
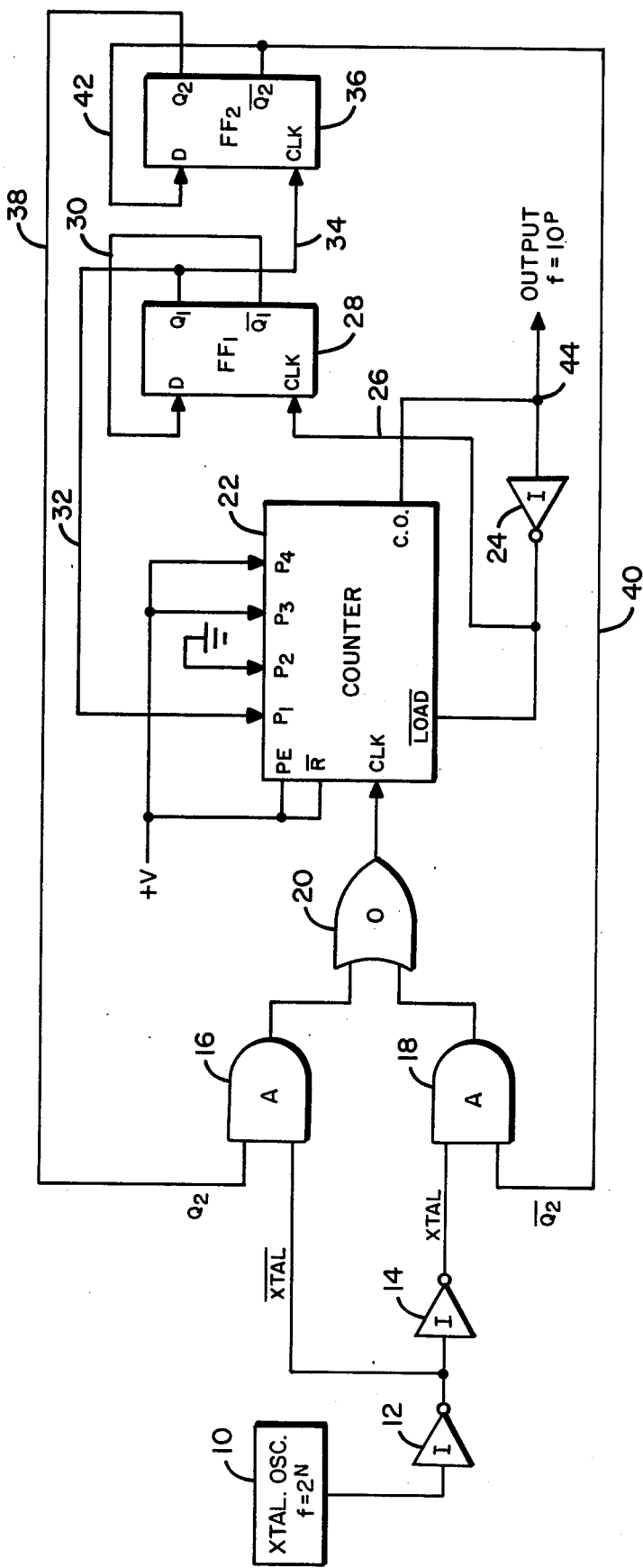
FIG. 1 is a logic diagram depicting the preferred embodiment of the present invention.

With reference to FIG. 1, there is indicated by numeral 10 a crystal controlled oscillator which is adapted to produce regularly occurring square wave signals at a predetermined frequency or repetition rate. In accordance with the teachings of the present invention, the oscillator 10 may comprise a conventional Pierce oscillator incorporating a commonly available crystal as the frequency regulating element thereof, the crystal being of the type commonly used in digital watch type applications. As such, it possesses a natural frequency of 32.768 KHz. Since this frequency is an integral power of 2, specifically, $2^{15}$, it is readily suitable for use in chronometers in that, by feeding the output therefrom to a 15 stage frequency divider, it is possible to obtain signals at a rate of one per second.

However, in other digital devices, it is desirable to work in a decimal number system rather than binary. As such, it is desirable to have a basic system clock rate which is an integral power of 10. Because crystals operating at a natural frequency of 32.768 KHz are so generally used, they are readily available in the marketplace, are extremely accurate, and sell at a reduced cost. It is for these reasons that it becomes desirable to utilize such a crystal in digital circuit applications, other than time pieces and the like. The frequency divider of the preferred embodiment accepts the output signals from the crystal oscillator 10 which may be operating at a frequency of 32.768 KHz and produces an output signal of a frequency which is an integral power of 10, e.g., 10 KHz.

The output from the crystal oscillator 10 is applied as an input to an inverter 12 whose output is connected to the input of a second inverter 14 and to a first input terminal of an AND gate 16. Similarly, the output from inverter 14 is coupled to a first input terminal of a second AND gate 18. The output terminals of the gates 16 and 18 are coupled to the input terminals of an OR gate 20.

The output from the OR gate 20 is applied to the Clock input terminal (CLK) of a synchronous programmable counter chip 22. In constructing the present invention, the counter chip 22 is preferably a type MC14161 integrated circuit, four-bit, binary counter manufactured and sold by the Motorola Semiconductor Products Corporation of Phoenix, Arizona, but other types of counter devices may also be employed so that limitation to the above indicated type is not intended. As is set forth in the Motorola Product Description relating to the MC14161 chip, these counters are fully programmable; that is, the outputs therefrom may be preset to either binary level. The presetting is synchronous such that when a low binary level is applied at the "Load" input, the counter is disabled for the duration of the $\overline{\text{Load}}$ pulse and the counter's outputs will agree with the input data applied to its terminals $P_1$ through $P_4$ following the next clock pulse, regardless of the levels of its "enable" inputs. The counter 22 also includes a carry output terminal labeled "C.O.". A "high" output signal will appear at this terminal when the value registered within the counter reaches $15_{10}$ ($1111_2$).

As is indicated in FIG. 1, the carry output terminal C.O. is connected through an inverter 24 to the "$\overline{\text{LOAD}}$" terminal of the counter. Hence, when the C.O. signal goes high, a low $\overline{\text{LOAD}}$ signal is applied to the counter such that the data present at that time at the input terminals $P_1$ through $P_4$ will be registered in the counter. Subsequent pulse signals applied to the CLK input terminal of the counter 22 will then advance the count so entered until the decimal 15 value is again reached, at which time the counter will again be loaded with the binary value present at its $P_1$ through $P_4$ input terminals.

The output from inverter 24 is coupled by way of a conductor 26 to the CLK input terminal of a first D-type flip-flop 28. As is well known in the art, a D-type flip-flop will be set to the particular binary value which is present at its D-input at the time that a positive going clock signal is applied to its CLK input terminal. The D-type flip-flop has two output terminals labeled Q and $\overline{\text{Q}}$. When the flip-flop is in its arbitrarily defined Set state, the output appearing at the Q terminal will be high and the output appearing at its $\overline{\text{Q}}$ output terminal will be low. However, when this flip-flop is switched, its opposite state, i.e., its Clear state, the output appearing at the Q terminal will be low and that appearing at the $\overline{\text{Q}}$ terminal will be high.

A conductor 30 couples the $\overline{\text{Q}}$ output terminal of flip-flop 28 back to its D-input terminal. The Q output terminal of flip-flop 28 is connected by a conductor 32 to the data input terminal $P_1$ of the counter 22. The second stage of the counter 22 has its data input terminal $P_2$ permanently connected to a binary low (ground). Stages $P_3$ and $P_4$ of the counter 22 have their inputs connected to a source of positive voltage $+V$ and, as such, are continuously at a binary high value. Thus, when the flip-flop 28 is in its Cleared state, the value entered into the counter 22 upon application of the LOAD enable pulse thereto will be $1100_2$ and when the flip-flop 28 is in its Set state, the value $1101_2$ will be entered into the counter.

The Q output from the flip-flop 28 is coupled by a conductor 34 to the clock CLK input terminal of a second control flip-flop 36. The flip-flop 36 is also a D-flip-flop and a conductor 38 connects its Q output terminal to a second input terminal of AND gate 16. In a similar fashion, a conductor 40 connects the $\overline{\text{Q}}$ output terminal of the flip-flop 36 to a second input terminal of the AND gate 18. The $\overline{\text{Q}}$ output terminal of the flip-flop 36 is also coupled back to its D input terminal by way of a conductor 42. The output from the frequency divider is obtained at the junction point 44 which is connected to the carry output C.O. of the counter chip 22.

Now that the construction of the preferred embodiment has been set forth in detail, consideration will be given to its mode of operation. In this regard, reference will be made to the timing diagram illustrated in FIG. 2 which shows the waveforms of the various signals at different points within the circuit of FIG. 1.

OPERATION

Figure 2:
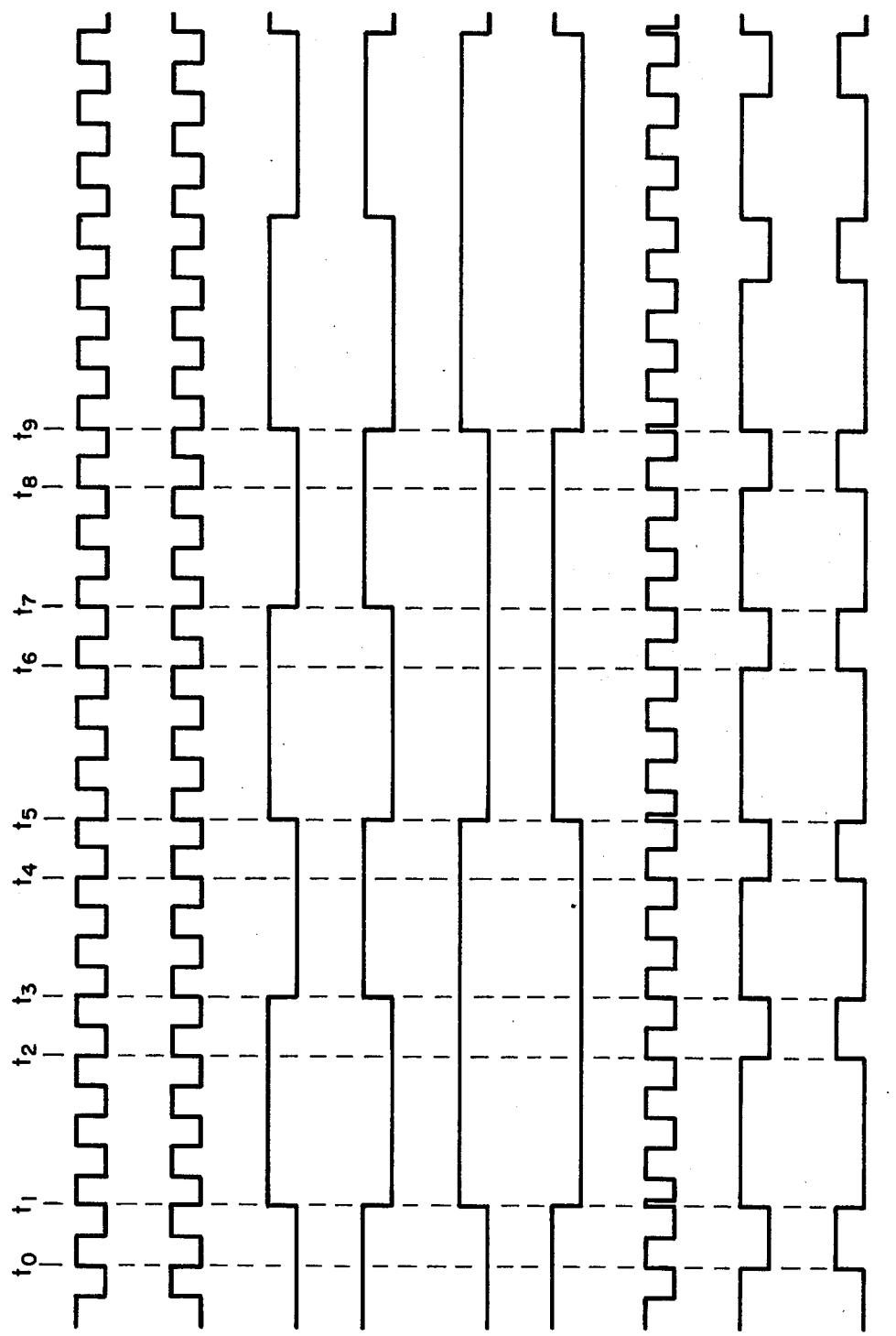
FIG. 2 illustrates the waveforms observed at various points within the schematic diagram of FIG. 1.

Waveform A illustrates the output obtained from the crystal oscillator 10 as well as that obtained after passing through the two inverters 12 and 14 in FIG. 1. It is generally a square wave signal having a predetermined frequency which is an integral power of 2, for example, $2^{15}$ which is equal to 32.768 KHz. Waveform B represents the signal appearing at the output of the first inverter stage 12 in FIG. 1. It can be seen that it is a signal which is 180° out of phase with respect to waveform A. Depending upon the state of the second control flip-flop 36, either AND gate 16 or AND gate 18 will be enabled to pass either the signals of waveform B or A to the input terminals of the OR circuit 20. Waveform G in FIG. 2 represents the signals appearing at the output from the OR gate 20.

Let it be assumed that operation begins at time $t_0$ when the count registered in the programmable counter 22 changes from 1110 to 1111. While registering $14_{10}$, just prior to time $t_0$, the first control flip-flop 28 is set such that its $Q_1$ output is low and its $\overline{Q_1}$ is high (waveforms C and D, respectively). At this time, the second control flip-flop 36 is also set such that its $Q_2$ output is low and its $\overline{Q_2}$ output is high. (See waveforms E and F.) Because the $\overline{Q_2}$ output signal is high, AND gate 18 is enabled by the input thereto applied over line 40. Gate 16 is enabled by the low $Q_2$ signal applied to it. Hence, it is the double inverted oscillator output signal of waveform A that is passing through the AND gate 18 and the OR gate 20 to the CLK input terminal of the counter 22.

When the value in the counter 22 reaches 1111 ($15_{10}$), it generates a carry output signal, C.O., which appears at the input junction of inverter 24 and which persists for one cycle of the input waveform applied to the counter's CLK input. Waveform I of FIG. 2 represents this C.O. signal at various points in time. The C.O. signal is applied to an inverter 24 whose output is connected to the $\overline{\text{LOAD}}$ enable input of the counter 22 and to the CLK input of the first control flip-flop 28. This signal is represented by waveform H in FIG. 2.

Control flip-flop 28 is set at the time that the low $\overline{\text{LOAD}}$ signal is applied to the counter 22 and is followed by a rising clock edge, and the digital value 1100 will be entered into the counter. At time $t_1$ the $\overline{\text{LOAD}}$ signal goes high and this positive going transition is applied to the CLK input terminal of the flip-flop 28 causing it to be switched to its Set state. As a result, the output signal $Q_1$ goes high (waveform C). This positive going transition is, in turn, applied to the CLK input terminal of the D-type flip-flop 36 such that it too is Set and its $Q_2$ output also goes high (waveform E).

The high signal is applied by way of conductor 38 to the enable input of AND 16 such that the $\overline{\text{XTAL}}$ output from inverter 12 (waveform B) passes through AND gate 16 and OR gate 20 to the CLK input of the counter 22. Because the counter had been preset to a value corresponding to $12_{10}$, it will have to receive three positive going transitions before reaching its $1111_2$ state. When the all ones state is again reached at time $t_2$, the counter 22 will again generate a positive going pulse at its C.O. output terminal. This high signal is inverted by inverter 24 and the resulting low signal, when applied to the $\overline{\text{LOAD}}$ terminal will cause a new data value to be entered into the counter. Because at this time flip-flop 28 is in its Set state, its $Q_1$ output is high and the value entered into the counter will now be $1101_2$ ($13_{10}$). Now, when the C.O. Signal (waveform I) again goes low at time $t_3$, the inverted version thereof again clocks flip-flop 28 to its Cleared state and its $Q_1$ output signal goes low. A low going signal is incapable of switching the state of the second control flip-flop 36 and it remains in its Set state such that the AND gate 16 remains enabled. Gate 18 is, of course, disabled at this time.

After two positive going transitions of the $\overline{\text{XTAL}}$ signals are applied to the counter via the AND gate 16 and the OR gate 20, the counter again reaches its all ones state at time $t_4$ and another high C.O. output from the counter is generated (see waveform I). Again, by recalling the state of the flip-flop 28 at this time, it will be seen that the counter 22 is again loaded with the binary value 1100 and at the conclusion of the C.O. pulse at time $t_5$, the flip-flop 28 is again clocked to its Set state. This action puts a high signal on the CLK input of the second control flip-flop 36 and it returns to its Cleared state. Now, the AND gate 18 is enabled while AND gate 16 is disabled. Hence, the XTAL pulses of waveform A are tallied for the duration that the flip-flop 36 remains in its Cleared state.

It may be noted from waveform G that each time that the flip-flop 36 changes state, a phase reversal takes place in the Counter Clock waveform because of the manner in which the signals XTAL and $\overline{\text{XTAL}}$ are selectively applied. By comparing the waveforms, A, B and I, it can be seen that on an alternating basis, three and one half and three cycles occur between successive C.O. signals. More specifically, between time $t_1$ and $t_3$, three and one half cycles of the $\overline{\text{XTAL}}$ input signals occur and that between time $t_3$ and $t_5$, exactly three cycles of the $\overline{\text{XTAL}}$ input occur. Continuing on, between time $t_5$ and $t_7$, three and one half cycles of the XTAL signals take place and between time $t_7$ and $t_9$, exactly three cycles of the XTAL waveform occur. On a continuing basis, then, it can be seen that on the average $$(3+3.5/2)=3.25$$

pulses occur between successive outputs on the junction 44 in FIG. 1. Accordingly, the frequency of the incoming signals from the oscillator 10 are effectively divided by a factor of 3.25. With an incoming frequency of 32.768 KHz, the frequency of the output signal appearing at the junction 44 will be approximately 10 KHz.

It can be seen, then, that there is provided by this invention, a novel circuit arrangement which may be used to convert the output from a crystal controlled oscillator operating at a nominal frequency of 32.768 KHz, which is an integral power of 2, to a 10 KHz signal, which is an integral power of 10. As such, commonly available crystals which are widely used in the digital watch industry may be utilized in other applications where decimal type operation is desired.

For the purpose of illustration only, and with no limitation intended, there is set forth below a designation of the commercially available logic devices which may be used in the implementation of the preferred embodiment:

Inverters 12, 14 & 24 — Type 4049
AND Gates 16 & 18 — Type 4081
OR Gate 20 — Type 4071
Flip-Flops 28 & 36 — Type 4013
Counter 22 — Type MC14161

It should be further understood that the foregoing disclosure relates only to a preferred embodiment of the invention, and that it is intended to cover all changes and modifications of the example of the invention herein chosen for the purpose of disclosure which do not constitute departures from the spirit and scope of the invention.

What is claimed is:

1. A frequency divider adapted to receive input signals of a frequency, $f_1 = 2^N$, where N is a first predetermined integer and for producing at its output a signal of a frequency $f_2 = 10^P$ where P is a second predetermined integer, comprising:
   (a) a source of regularly occurring electrical signals of said frequency, $f_1$;
   (b) a programmable counter having data input terminals, a clock input terminal and a carry output terminal;
   (c) a first control means having an input terminal coupled to said carry output terminal of said counter for alternately causing a first and a second binary number value to be entered into said counter via said data input terminals each time a carry output signal is produced at the carry output terminal of said counter; and
   (d) a second control means responsive to the output from said first control means for selectively applying said regularly occurring electrical signals of frequency, $f_1$, or the complement thereof to said clock input terminal of said counter, the arrangement being such that said carry output signal is of a frequency approximately equal to $f_2$.

2. Apparatus as in claim 1 wherein said first control means comprises:
   (a) a first D-type flip-flop having a clock input terminal coupled to said carry output terminal of said counter, a data input terminal and true and complement output terminals;
   (b) means connecting one of said true and complement output terminals of said first flip-flop to its data input terminal; and
   (c) means connecting the other of said true and complement output terminals to at least one of said data input terminals of said programmable counter and to said second control means.

3. Apparatus as in claim 2 wherein said second control means comprises:
   (a) a second D-type flip-flop having a clock input terminal coupled to said one of said true and complement output terminals of said first flip-flop, a data input terminal and true and complement output terminals;
   (b) gating means having a first input coupled to said source of regularly occurring electrical signals and having an output coupled to said clock input terminal of said counter;
   (c) means coupling said true and said complementary output terminals of said second D-type flip-flop to a second input of said gating means; and
   (d) means connecting one of said true and complement output terminals of said second D-type flip-flop to its data input terminal.

4. Apparatus as in claim 3 wherein said gating means comprises:
   (a) a first and a second AND gate, each having a pair of input terminals and an output terminal;
   (b) an OR gate having a pair of input terminals and an output terminal;
   (c) means connecting said source of regularly occurring signals to one of said pair of input terminals on each of said first and second AND gates;
   (d) means connecting the output terminals of said first and second AND gates to said pair of input terminals of said OR gate;
   (e) means connecting the output terminal of said OR gate to said clock input terminal of said counting means;
   (f) means connecting the true output terminal of said second D-type flip-flop to the other of said pair of input terminals on said first AND gate; and
   (g) means connecting the complement output of said second D-type flip-flop to the other of said pair of input terminals on said second AND gate.

5. Apparatus as in claim 1 wherein $N = 15$ and $P = 4$.

6. Apparatus as in claim 1 wherein said first binary number value is 1100 and said second binary number value is 1101.

* * * * *